United States Patent
Miyamoto et al.

(10) Patent No.: US 10,425,072 B2
(45) Date of Patent: Sep. 24, 2019

(54) OUTPUT CIRCUIT AND OUTPUT METHOD

(71) Applicant: OMRON Corporation, Kyoto (JP)

(72) Inventors: Kazuaki Miyamoto, Fukuchiyama (JP); Ryota Hasegawa, Ayabe (JP); Hiroyuki Tsuchida, Ayabe (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 16/161,103

(22) Filed: Oct. 16, 2018

(65) Prior Publication Data

US 2019/0214978 A1 Jul. 11, 2019

(30) Foreign Application Priority Data

Jan. 11, 2018 (JP) ................. 2018-002674

(51) Int. Cl.
*H03K 17/042* (2006.01)
*H04B 1/04* (2006.01)

(52) U.S. Cl.
CPC ............. *H03K 17/042* (2013.01); *H04B 1/04* (2013.01)

(58) Field of Classification Search
None
See application file for complete search history.

(56) References Cited

U.S. PATENT DOCUMENTS

| | | | |
|---|---|---|---|
| 4,847,520 A | 7/1989 | O'Neill et al. | |
| 5,128,553 A | 7/1992 | Nelson | |
| 5,903,425 A | 5/1999 | Scheraga | |
| 7,394,316 B1 * | 7/2008 | Alenin | H03F 3/26 330/263 |

FOREIGN PATENT DOCUMENTS

| | | |
|---|---|---|
| JP | S60213121 | 10/1985 |
| JP | H0732336 | 4/1995 |

OTHER PUBLICATIONS

"Search Report of Europe Counterpart Application", dated Mar. 28, 2019, p. 1-p. 8.
"Office Action of Korean Counterpart Application," with English translation thereof, dated Jun. 19, 2019, p. 1-p. 7.

* cited by examiner

*Primary Examiner* — Jeffery S Zweizig
(74) *Attorney, Agent, or Firm* — JCIPRNET

(57) ABSTRACT

An output circuit outputs communication signals and communicates with an external device ED, and includes: a PNP first transistor, which is capable of outputting a collector current as the communication signals; and a first current source, which is capable of changing a base current of the first transistor, and which reduces the base current to a predetermined current value after the first transistor is turned on and before the first transistor is turned off.

20 Claims, 7 Drawing Sheets

OUTPUT CIRCUIT AND OUTPUT METHOD

CROSS-REFERENCE TO RELATED APPLICATION

This application claims the priority benefit of Japan Patent Application No. 2018-002674, filed on Jan. 11, 2018. The entirety of the above-mentioned patent application is hereby incorporated by reference herein and made a part of this specification.

BACKGROUND OF THE DISCLOSURE

Technical Field

The present disclosure relates to an output circuit and an output method.

Related Art

Conventionally, the following output circuit is known in which an emitter and a collector of a PNP transistor are connected between a base and an emitter of a base input transistor, when the base input transistor using input signals is turned off, the PNP transistor is driven to be turned on to form a desired current path, and base accumulated charges of the base input transistor are discharged via the PNP transistor (see patent literature 1 [Japanese Laid-open No. 60-213121]). The output circuit discharges the base accumulated charges of the base input transistor and forms the current path by one PNP transistor, and thus number of elements can be reduced compared with a case in which circuit elements corresponding to respective purposes are arranged.

Meanwhile, when the output circuit provided with a PNP transistor outputs a collector current of the PNP transistor as communication signals and communicates with an external device, in order to achieve high-speed communication, it is necessary to switch between the ON state and OFF state of the PNP transistor in a short time.

Generally, the PNP transistor has a property that the turn-off time before the OFF state is reached depends on a charge amount accumulated in the base during the ON state (referred to as "base accumulated charge amount" hereinafter).

Therefore, there is a problem that when the base accumulated charge amount of the PNP transistor during the ON state is large, the turn-off time for the PNP transistor to reach the OFF state becomes long. As a result of the long turn-off time, the communication speed between the output circuit and the external device decreases, and the high-speed communication is hindered.

SUMMARY

The output circuit of one embodiment of the present disclosure is an output circuit that outputs communication signals and communicates with an external device and includes: a PNP first transistor, which is capable of outputting a collector current as the communication signals; and a first current source, which is capable of changing a base current of the first transistor, and reduces the base current to a predetermined current value after the first transistor is turned on and before the first transistor is turned off.

The output method of another embodiment of the present disclosure is an output method of an output circuit that outputs communication signals and communicates with an external device, and the output method includes a step in which a first current source, which is capable of changing a base current of a PNP first transistor, reduces the base current to a predetermined current value after the first transistor is turned on and before the first transistor is turned off, wherein the PNP first transistor is capable of outputting a collector current as the communication signals.

BRIEF DESCRIPTION OF THE DRAWINGS

FIG. 3 is a circuit diagram illustrating an operation when a first transistor is turned on.

DESCRIPTION OF THE EMBODIMENTS

Figure 1:
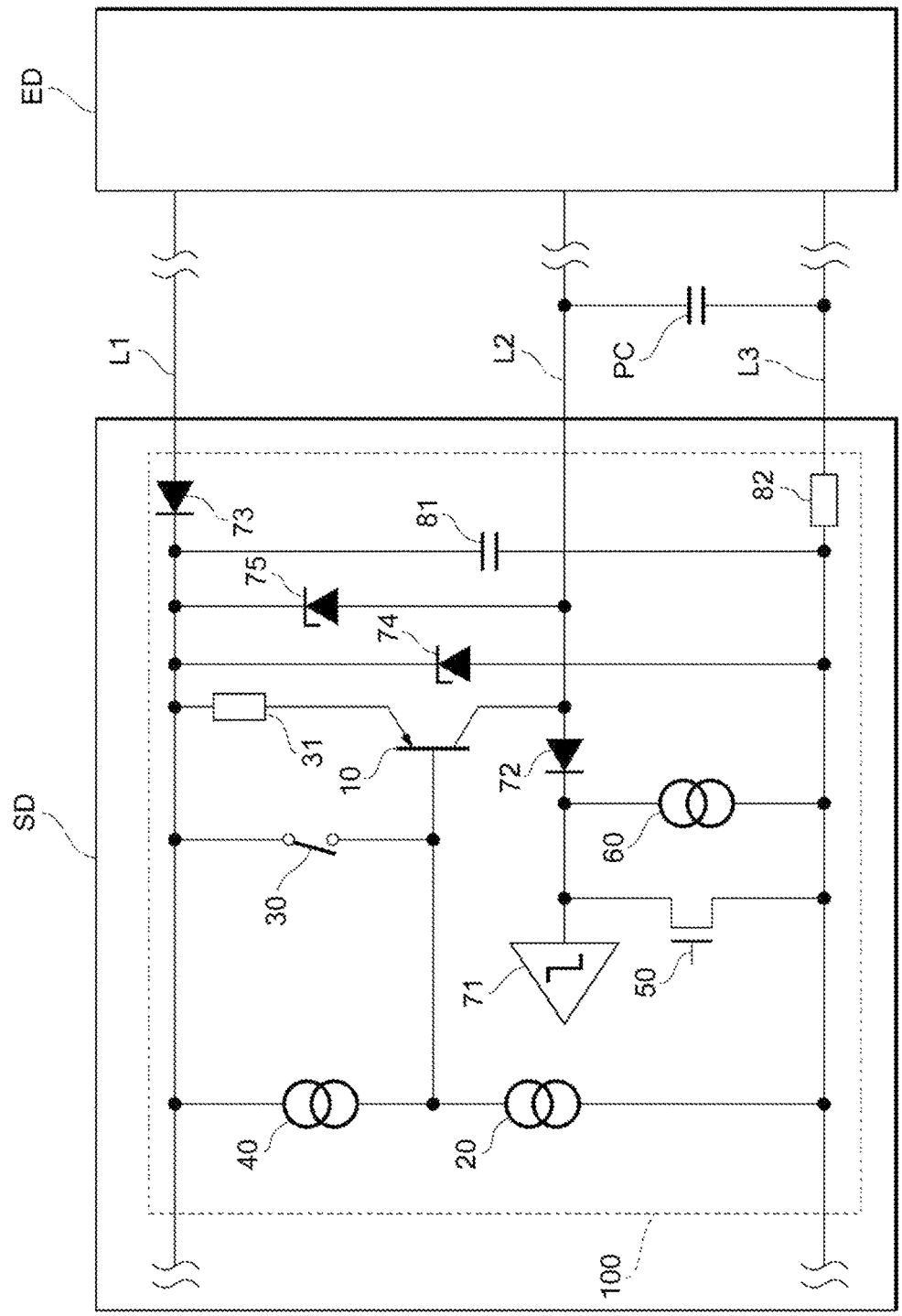
FIG. 1 is a circuit diagram illustrating a configuration of an output circuit of an embodiment.

Therefore, the present disclosure aims to provide an output circuit and an output method capable of shortening the turn-off time of a transistor.

According to this embodiment, after the first transistor is turned on and before the first transistor is turned off, the base current is reduced to the predetermined current value. Accordingly, compared with a case in which the base current is fixed when the first transistor is on, the base accumulated charge amount of the first transistor can be reduced. Therefore, the turn-off time of the first transistor can be shortened, and the decrease in the communication speed with the external device can be suppressed. Besides, compared with a push-pull configuration for example, which is provided with a PNP transistor on a high side and a NPN transistor on a low side, the number of components (number of elements) can be reduced, and the output circuit can be miniaturized.

In the embodiment described above, the predetermined current value may be 1/r (r is a real number over 2) of the current value of the base current when the first transistor is turned on.

According to this embodiment, the predetermined current value is 1/r of the current value of the base current when the first transistor is turned on. Accordingly, an output circuit which reduces the base accumulated charge amount of the first transistor can be easily realized.

In the embodiment described above, a switch connected between a base and an emitter of the first transistor may be further included, and the switch is turned on when the first transistor is turned off.

According to this embodiment, when the first transistor is turned off, the switch is turned on. Accordingly, due to a resistance between the base and the emitter of the first transistor, the base accumulated charge amount of the first transistor can be discharged rapidly. Therefore, the turn-off time of the first transistor can be further shortened.

In the embodiment described above, a second current source, which supplies a constant current to the base of the first transistor when the first transistor is turned off, may be further included.

According to this embodiment, when the first transistor is turned off, a constant current is supplied to the base of the first transistor. Accordingly, due to a reverse current supplied to the base of the first transistor, the base accumulated charge amount of the first transistor can be rapidly discharged. Therefore, the turn-off time of the first transistor can be further shortened.

In the embodiment described above, a second transistor, which is connected to a signal line outputting the communication signals and a reference potential line, and which is turned on when the first transistor is turned off, may be further included.

According to this embodiment, when the first transistor is turned off, the second transistor is turned on. Here, the signal line and the reference potential line are lines connected to an external device, and an inter-line parasitic capacity between the signal line and the reference potential line may be generated. The inter-line parasitic capacity causes the time, which is required for the collector potential to reach a Low level after the first transistor is turned off, to be delayed. Therefore, by turning on the second transistor when the first transistor is turned off, the inter-line parasitic capacity between the signal line and the reference potential line can be discharged. Therefore, the time for the collector potential to reach the Low level after the first transistor is turned off can be accelerated.

In the embodiment described above, a third current source, which applies a constant current flows between the signal line and the reference potential line, may be further included.

According to this embodiment, a constant current flows between the signal line and the reference potential line. Accordingly, even when the second transistor is turned off, a constant current still flows between the signal line and the reference potential line, and thus the inter-line parasitic capacity between the signal line and the reference potential line can be reduced. Therefore, the time for the collector potential to reach the Low level after the first transistor is turned off can be accelerated.

In the embodiment described above, the output circuit may have a COM mode for communicating with the external device and a SIO mode for supplying a load current to the external device, and in the SIO mode, the first transistor is capable of outputting the collector current as the load current.

According to this embodiment, in the SIO mode, the first transistor is capable of outputting the collector current as the load current. Accordingly, the output circuit can make the two modes compatible, that is, in the COM mode, the output circuit communicates with the external device, and in the SIO mode, the output circuit supplies the load current to a high-load external device.

According to this embodiment, after the first transistor is turned on and before the first transistor is turned off, the base current is reduced to the predetermined current value. Accordingly, compared with a case in which the base current is fixed when the first transistor is on, the base accumulated charge amount of the first transistor can be reduced. Therefore, the turn-off time of the first transistor is shortened, and the decrease in the communication speed with the external device can be suppressed. Besides, compared with a push-pull configuration for example, which is provided with a PNP transistor on a high side and a NPN transistor on a low side, the number of components (number of elements) can be reduced, and the output circuit can be miniaturized.

In the embodiment described above, a step may be further included in which a switch connected between a base and an emitter of the first transistor is turned on when the first transistor is turned off.

According to this embodiment, when the first transistor is turned off, the first transistor switch connected between the base and the emitter of the first transistor is turned on. Accordingly, due to a resistance between the base and the emitter of the first transistor, the base accumulated charge amount of the first transistor can be discharged rapidly. Therefore, the turn-off time of the first transistor can be further shortened.

In the embodiment described above, a step may be further included in which a second current source supplies a constant current to the base of the first transistor when the first transistor is turned off.

According to this embodiment, when the first transistor s turned off, a constant current is supplied to the base of the first transistor. Accordingly, due to a reverse current supplied to the base of the first transistor, the base accumulated charge amount of the first transistor can be rapidly discharged. Therefore, the turn-off time of the first transistor can be further shortened.

In the embodiment described above, a step may further included in which a second transistor connected to a signal line outputting the communication signals and a reference potential line is turned on when the first transistor is turned off.

According to this embodiment, when the first transistor is turned off, the second transistor connected to the signal line outputting the communication signals and the reference potential line is turned on. Here, the signal line and the reference potential line are lines connected to the external device, and an inter-line parasitic capacity between the signal line and the reference potential line may be generated. The inter-line parasitic capacity causes a discharge time to be lengthened when the base accumulated charge amount of the first transistor is discharged. Therefore, by turning on the second transistor when the first transistor is turned off, the inter-line parasitic capacity between the signal line and the reference potential line can be discharged. Therefore, the discharge time of the base accumulated charge amount of the first transistor can be shortened.

In the embodiment described above, a step may be further included in which a third current source applies a constant current between the signal line and the reference potential line.

According to this embodiment, a constant current flows between the signal line and the reference potential line. Accordingly, even when the second transistor is turned off, a constant current still flows between the signal line and the reference potential line, and thus the inter-line parasitic capacity between the signal line and the reference potential line can be reduced. Therefore, the discharge time of the base accumulated charge amount of the first transistor can be shortened.

According to the present disclosure, the output circuit and the output method capable of shortening the turn-off time of the transistor can be provided.

Embodiments of the present disclosure are described with reference to accompanying drawings. Moreover, in each drawing, components denoted by the same symbols have the same or similar configuration.

Configuration Example

First, one configuration of an output circuit of the embodiment is described with reference to FIG. 1. FIG. 1 is a circuit diagram illustrating a configuration of an output circuit 100 of the embodiment.

As shown in FIG. 1, a sensor device SD includes the output circuit 100 as an input-output interface. The output circuit 100 is used to output communication signals and communicate with an external device ED. The output circuit 100 communicates in accordance with IO-Link that is a communication standard for field apparatus such as a sensor, an actuator and the like.

IO-Link has a COM mode for performing digital communication of data (information) and a SIO mode for performing digital communication of ON/OFF (binary information). The COM mode is used in, for example, a case in which a master machine is connected as the external device ED and data of the sensor device SD is transmitted to the external device ED. Besides, in the COM mode, three kinds of communication speeds, namely COM1: 4.8 k [bps], COM2: 38.4 k [bps], COM1: 230.4 k [bps], are specified. On the other hand, the SIO mode is used in, for example, a case in which another device machine is connected as the external device ED and a load current is supplied to the external device ED.

The sensor device SD is connected to the external device ED via a power line L1, a signal line L2, and a reference potential line L3. In the specification of the IO-Link, the three lines can be extended up to 20 meters at most.

In the description below, except cases that are specified, examples are described in which the output circuit 100 functions (serves) as an output interface of the sensor device SD, but the present disclosure is not limited thereto. The output circuit 100 may also function (serve) as an input interface of the sensor device SD. In this case, signals are input from the external device ED to the output circuit 100 via the signal line L2.

The output circuit 100 includes a first transistor 10, a first current source 20, a switch 30, a first resistor 31, a second current source 40, a second transistor 50, a third current source 60, a comparator 71, a first diode 72, a second diode 73, a third diode 74, a fourth diode 75, a capacitor 81, and a second resistor 82.

The first transistor 10 is configured to be capable of outputting a collector current as a communication signal of the output circuit 100 in the COM mode. Besides, the first transistor 10 is configured to be capable of outputting the collector current as a load current supplied by the output circuit 100 in the SIO mode. Accordingly, the output circuit 100 can make the two modes compatible, that is, in the COM mode, the output circuit 100 communicates with the external device ED, and in the SIO mode, the output circuit 100 supplies the load current to the high-load external device ED.

Specifically, the first transistor 10 is a PNP bipolar transistor, and has the switching function and the function of current amplification. An emitter of the first transistor 10 is connected to the power line L1 via the first resistor 31. The first resistor 31 is used to detect, by a voltage, an over current flowing in the first resistor 31 when the connected load is short circuited, and prevent the damage of the first transistor 10 due to the over current. On the other hand, a collector of the first transistor 10 is connected to the signal line L2. Accordingly, the first transistor 10 can output the collector current to the external device ED via the signal line L2. That is, the output circuit 100 is an open-collector output circuit using the first transistor 10.

Here, the first transistor 10 which is a PNP transistor accumulates a base accumulated charge amount between the base and the emitter in an ON state. Besides, the first transistor 10 has a property that the turn-off time before the OFF state is reached depends on the charge amount.

The first current source 20 is configured to be capable of changing the base current of the first transistor 10. Specifically, the first current source 20 is connected between the base of the first transistor 10 and the reference potential line L3. The first current source 20 operates based on a control signal input from a control part (not illustrated) of the sensor device SD. Besides, the first current source 20 reduces the base current to a predetermined current value after the first transistor 10 is turned on and before the first transistor 10 is turned off, and the detail is described later.

The predetermined current value is 1/r of the current value of the base current when the first transistor 10 is turned on (r is a real number over 2).

One end of the switch 30 is connected to the base of the first transistor 10, and the other end is connected to the power line L1 via the second diode 73. Accordingly, the switch 30 is connected between the base and the emitter of the first transistor 10 via the first resistor 31. The switch 30 switches to ON or OFF based on the control signal input from the control part of the sensor device SD. Besides, the switch 30 is turned on when the first transistor 10 is turned off, and the detail is described later.

The second current source 40 is configured to be capable of supply a constant current to the base of the first transistor 10. Specifically, the second current source 40 is connected between the base of the first transistor 10 and the power line L1 through the second diode 73. The second current source 40 starts or stops supplying a constant current to the base of the first transistor 10 based on the control signal input from the control part of the sensor device SD. Besides, the second current source 40 supplies a constant current to the base of the first transistor 10 when the first transistor 10 is turned off, and the detail is described later.

In the example shown in FIG. 1, the second transistor 50 is an N-channel MOSFET (Metal-Oxide-Semiconductor Field-Effect Transistor). A drain of the second transistor 50 is connected to the signal line L2 via the first diode 72, and a source is connected to the reference potential line L3 via the second resistor 82. The control signal is input from the control part of the sensor device SD to a gate of the second transistor 50, and the second transistor 50 is turned on or off based on a voltage of the control signal. Besides, the second transistor 50 is turned on when the first transistor is turned off, and the detail is described later.

As described above, the signal line L2 and the reference potential line L3 are lines connected to the external device ED, and the line is 20 meters at most. Therefore, an inter-line parasitic capacity PC exists between the signal line L2 and the reference potential line L3. An internal parasitic capacity of the sensor device SD is 1 [nF] at most; in contrast, the inter-line parasitic capacity PC is 3 [nF] at most. Therefore, the inter-line parasitic capacity PC is dominant in the whole parasitic capacity and cannot be ignored. The inter-line parasitic capacity PC causes the time, which is required for the collector potential to reach a Low level after the first transistor 10 is turned off, to be delayed.

The third current source 60 is configured so as to apply a constant current between the signal line L2 and the reference potential line L3. Specifically, the third current source 60 applies a constant current flowing from the signal line L2 to the reference potential line L3.

The comparator 71 is configured so as to detect a reception signal (reception data) input from the external device ED via the signal line L2. Specifically, in the comparator 71, the signal line L2 is connected to a non-inverting input terminal, and a reference voltage source is connected to an inverting input terminal. When a voltage value of the reception signal input via the signal line L2 is above the voltage value of the reference voltage source, the comparator 71 outputs a detection signal having a relatively high voltage value (referred to as "H level" hereinafter). On the other hand, when the voltage value of the reception signal input via the signal line L2 is below the voltage value of the reference voltage source, the comparator 71 outputs a detection signal having a relatively low voltage value (referred to as "L level" hereinafter).

The first diode 72 is used to prevent an over voltage from being input to the signal line L2. The second diode 73 is used to make sure that the current does not flow when the connection to the power line L1 is incorrect (reverse connection protection). The third diode 74 is used to absorb the noise generated between the power line L1 and the reference potential line L3 (protection from input of a surge current). The fourth diode 75 is used to absorb the noise generated between the power line L1 and the signal line L2 (protection from input of a surge current). Moreover, Zener diodes are usually used as the third diode 74 and the fourth diode 75.

The capacitor 81 and the second resistor 82 form an integration circuit. The capacitor 81 is used to smooth a power supply voltage and is connected to the power line L1 and the reference potential line L3.

Operation Example

Figure 2:
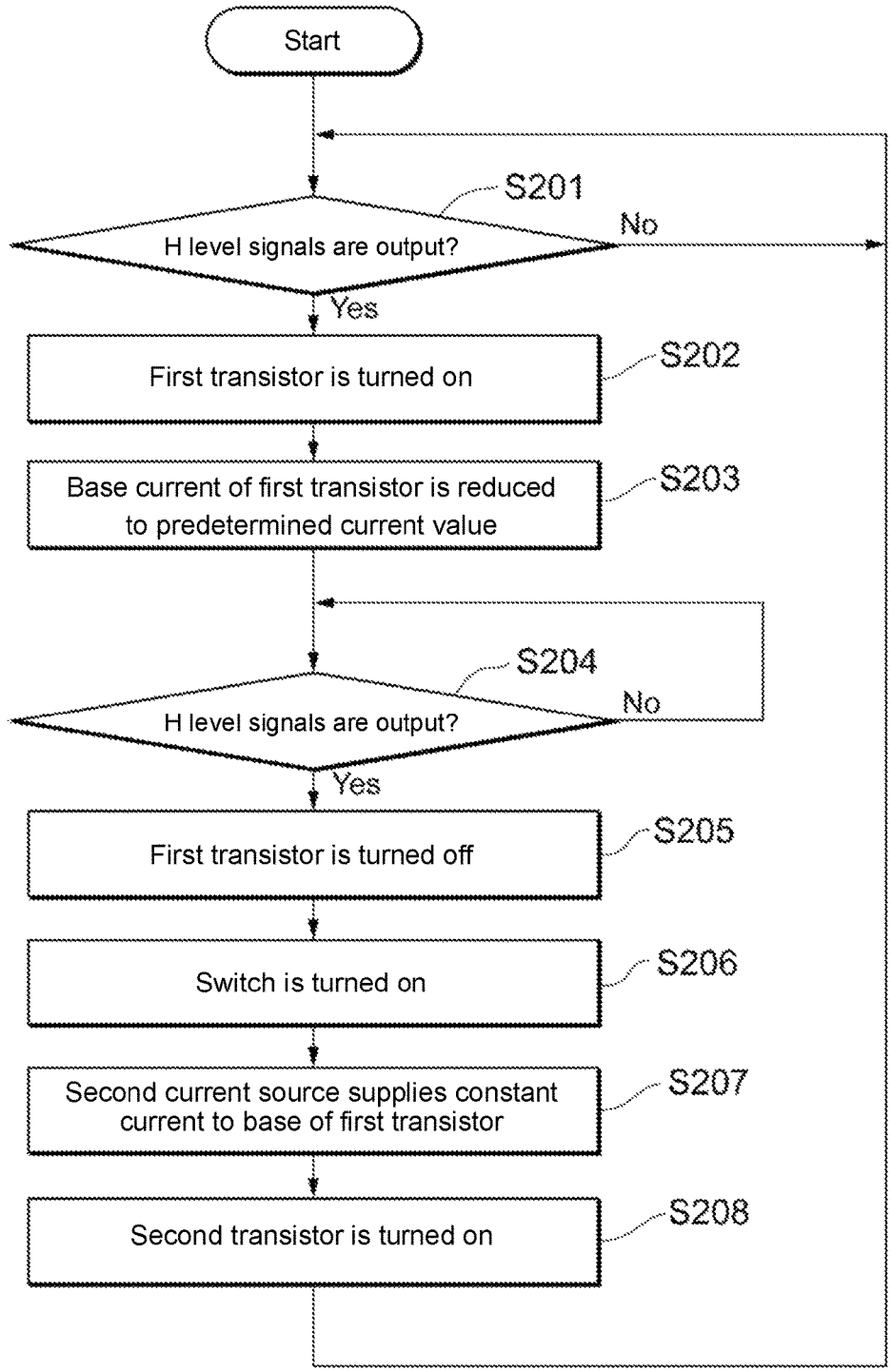
FIG. 2 is a flowchart illustrating a schematic operation in a COM mode of an output circuit.
Figure 3:
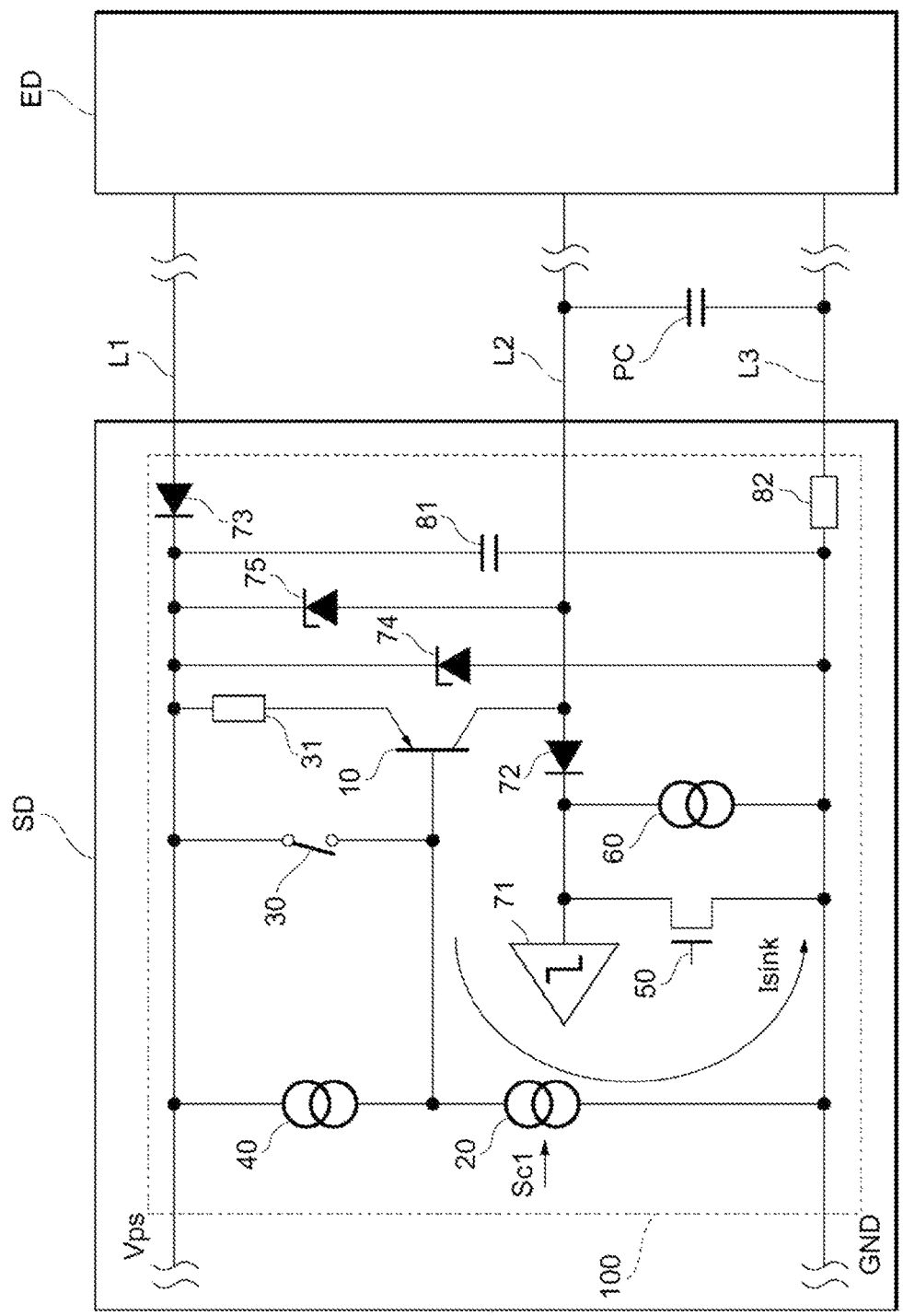
Figure 4:
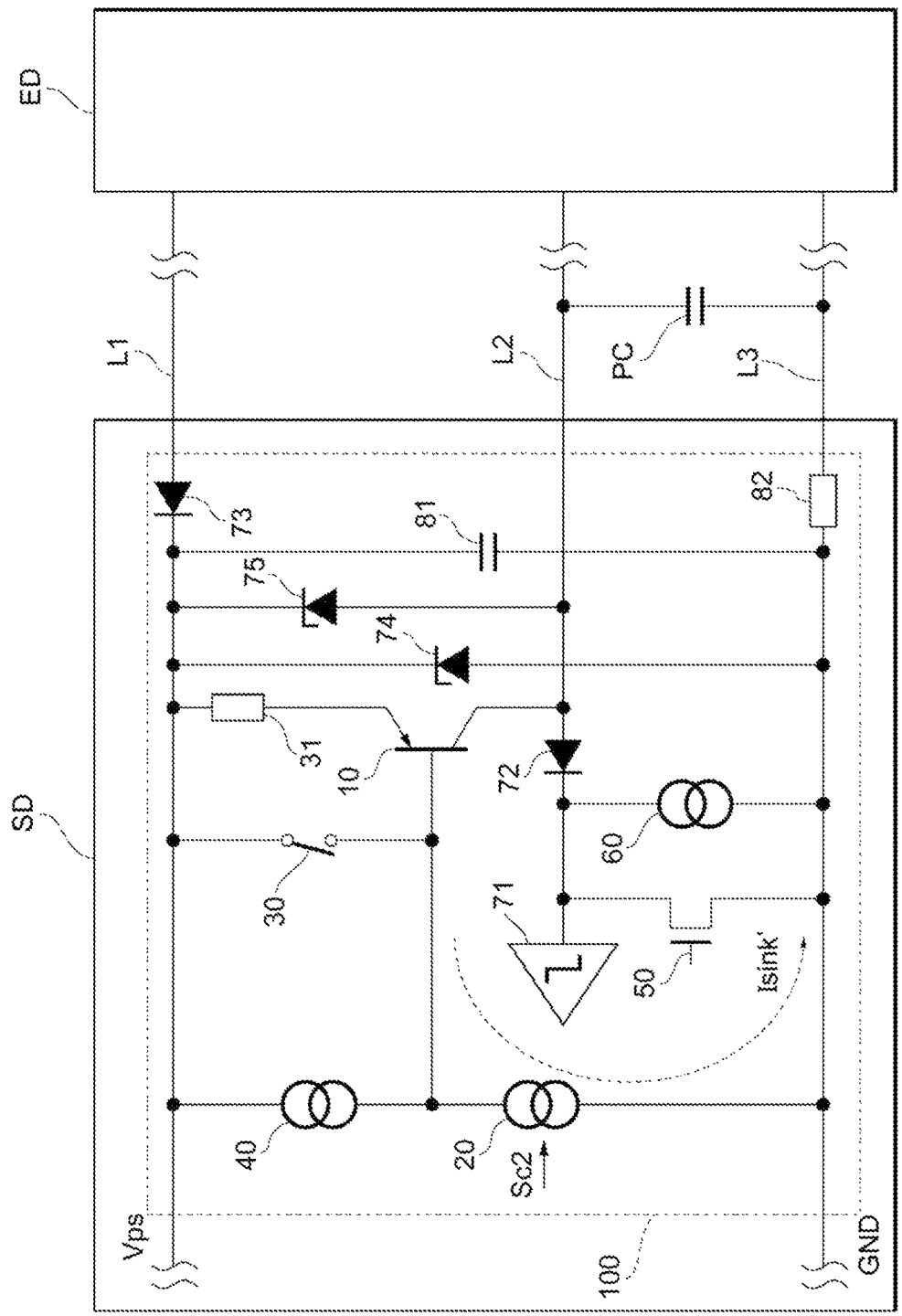
FIG. 4 is a circuit diagram illustrating an operation when a base current of a first transistor is reduced.
Figure 5:
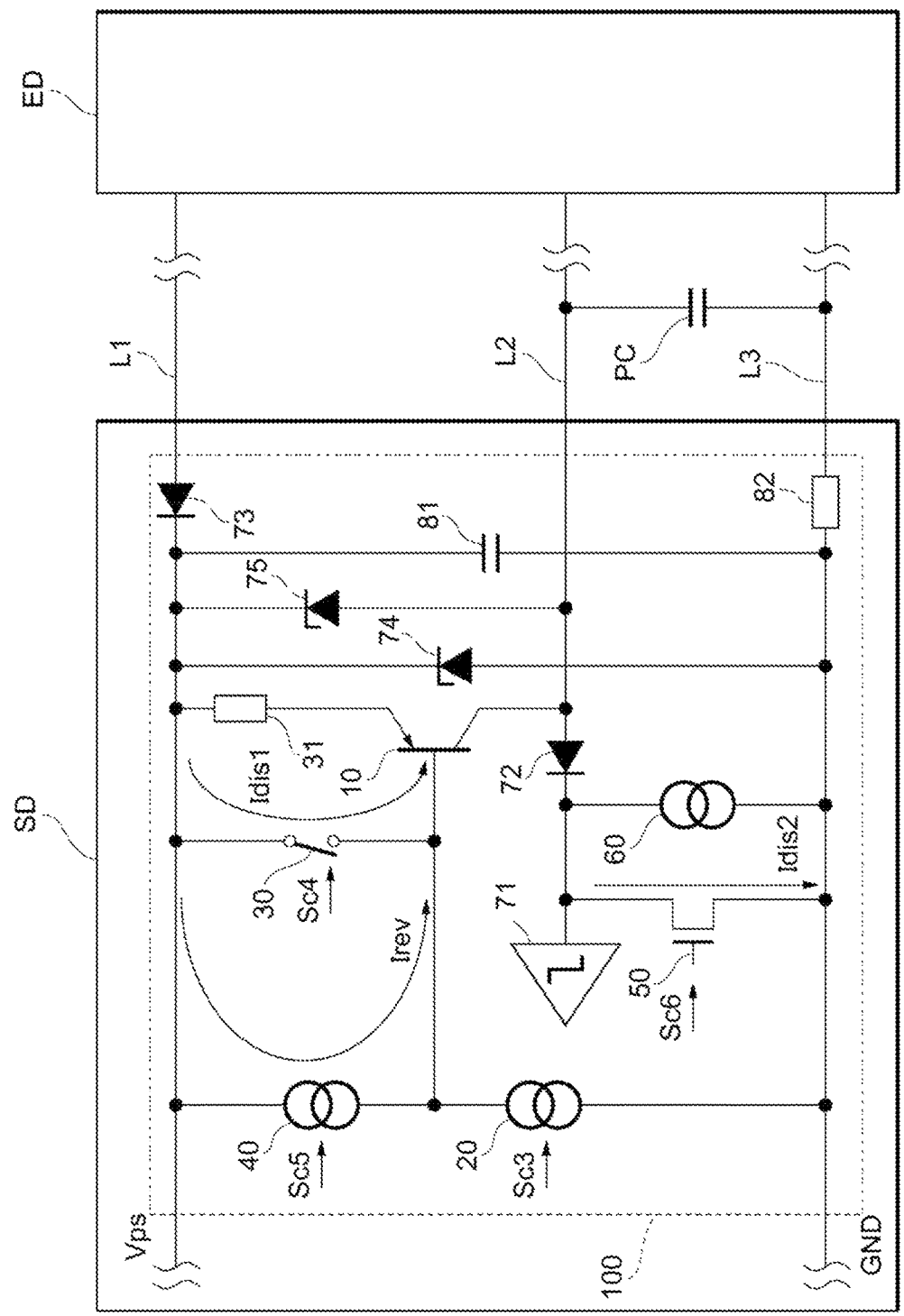
FIG. 5 is a circuit diagram illustrating an operation when a first transistor is turned off.
Figure 6:
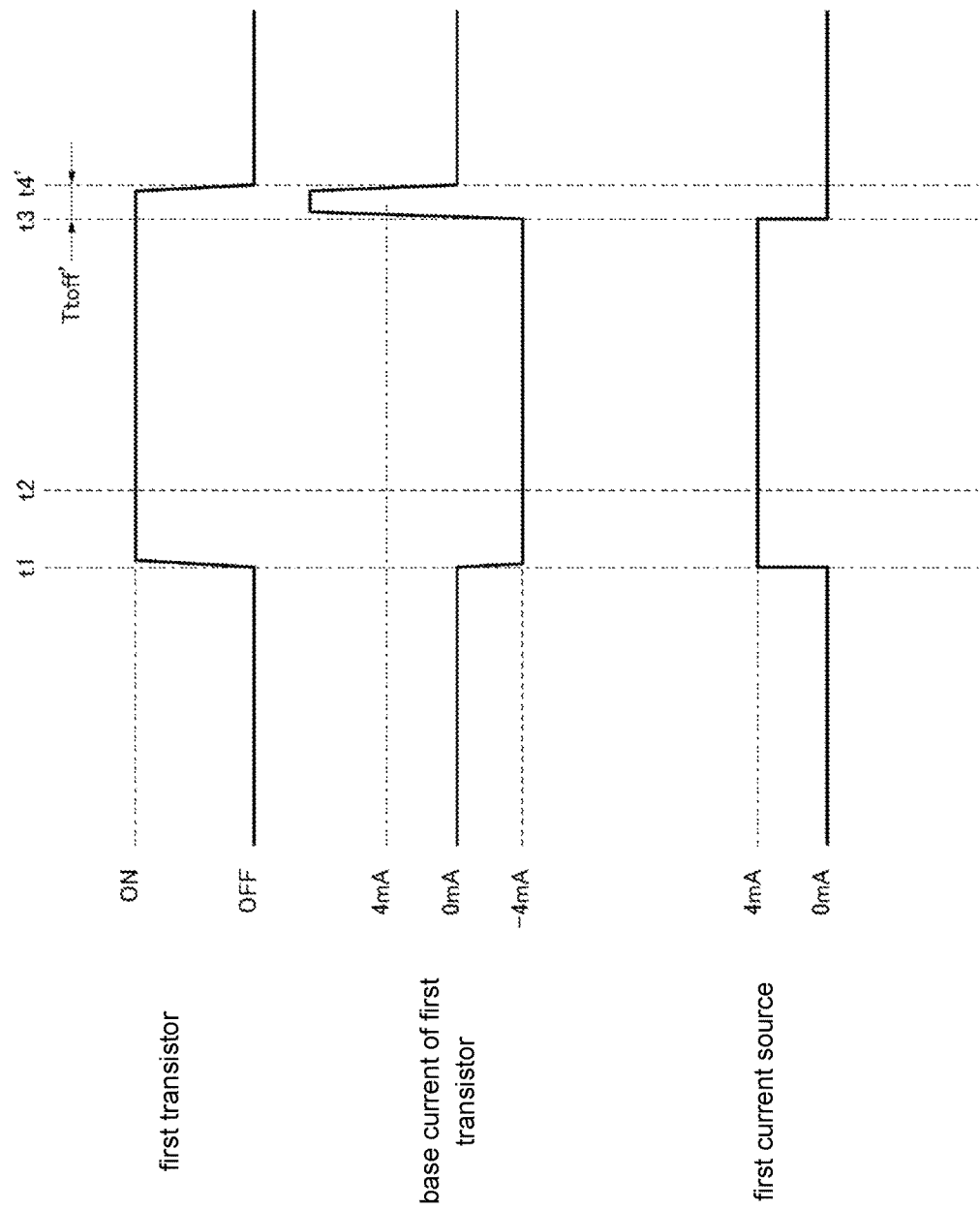
FIG. 6 is a timing chart illustrating an operation of an existing output circuit.
Figure 7:
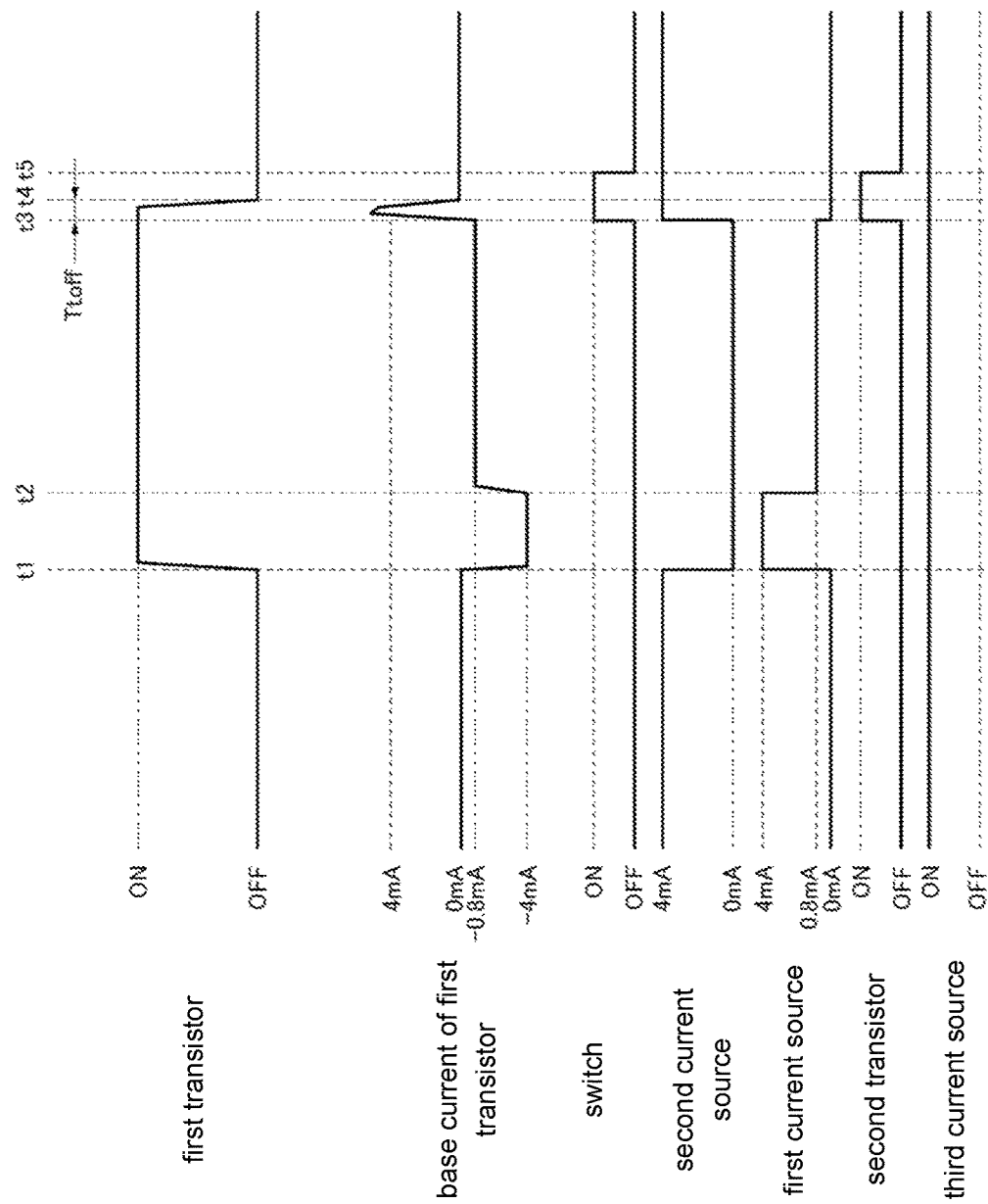
FIG. 7 is a timing chart illustrating an operation of an output circuit of an embodiment.

Next, an example of the operation of the output circuit in the embodiment is described with reference to FIG. 2 to FIG. 7. FIG. 2 is a flowchart illustrating a schematic operation in the COM mode of the output circuit 100. FIG. 3 is a circuit diagram illustrating the operation when the first transistor 10 is turned on. FIG. 4 is a circuit diagram illustrating the operation when the base current of the first transistor 10 is reduced. FIG. 5 is a circuit diagram illustrating the operation when the first transistor 10 is turned off. FIG. 6 is a timing chart illustrating the operation of an existing output circuit. FIG. 7 is a timing chart illustrating the operation of the output circuit 100 of the embodiment.

For example, when the SIO mode is switched to the COM mode by inputting the control signal from the external device ED via the signal line L2, the sensor device SD performs a COM mode processing S200 shown in FIG. 2.

As shown in FIG. 2, first, the sensor device SD determines whether an H level signal is output from the output circuit 100 (S201). The sensor device SD repeats step S201 until an H level signal is input from the output circuit 100. Moreover, in an initial state, the output circuit 100 outputs an L level signal.

When the determination result of step S201 is that an H level signal is output from the output circuit 100, the sensor device SD outputs a control signal to drive the first current source 20, and the first transistor 10 is turned on (S202).

As shown in FIG. 3, when the reference potential line L3 is grounded and has a reference potential GND, and the potential of the power line L1 has a power supply voltage Vps, the first current source 20 starts based on an input control signal Sc1 and sucks the base current of the first transistor 10. That is, a sink current Isink shown by a solid line arrow flows. When the sink current Isink flows, the potential of the base of the first transistor 10 decreases; as a result, when a voltage Vbe between the base and the emitter is larger than the predetermined value, the first transistor 10 is turned on. Accordingly, the collector current of the first transistor 10 can be output via the signal line L2, and H level signals are output from the output circuit 100.

Back to the description of FIG. 2, next, the sensor device SD outputs control signals to the first current source 20 in the state that a power supply voltage is applied between the power line L1 and the reference potential line L3, and the first current source 20 reduces the base current to the predetermined current value (S203).

As shown in FIG. 4, the first current source 20 reduces the base current to the predetermined current value based on an input control signal Sc2. That is, a sink current Isink' shown by a broken line arrow flows. Here, in the state that the base current starts to flow in step S202, the voltage Vbe between the base and the emitter of the first transistor 10 becomes fixed or substantially fixed regardless of the current value of the base current. Accordingly, when the first transistor 10 is turned on, even if the first current source 20 reduces the base current to the predetermined current value, the ON state of the first transistor 10 is maintained.

Back to the description of FIG. 2, next, the sensor device SD determines whether an L level signal is output from the output circuit 100 (S204). The sensor device SD repeats step S204 until an L level signal is output from the output circuit 100. That is, the sensor device SD outputs H level signals until an L level signal is output from the output circuit 100.

When the determination result of step S204 is that an L level signal is output from the output circuit 100, the sensor device SD outputs a control signal to stop the first current source 20, and the first transistor 10 is turned off (S205).

Next, the sensor device SD outputs a control signal to turn the switch 30 on (S206). Moreover, after step S206, when a predetermined time passed, the sensor device SD outputs a control signal to turn the switch 30 off.

Next, the sensor device SD outputs a control signal to drive the second current source 40, and supplies a constant current to the base of the first transistor 10 (S207).

Next, the sensor device SD outputs a control signal to turn the second transistor 50 on (S208). Moreover, after step S208, when the predetermined time passed, the sensor device SD outputs a control signal to turn the second transistor 50 off.

After step S208, the sensor device SD returns to step S201 again, and repeats step S201 to step S208 until, for example, the COM mode is switched to the SIO mode.

In the embodiment, for the sake of description, the example is shown in which step S205 to step S208 are performed in sequence, but the present disclosure is not limited thereto. For example, the sequence of steps S205-S208 may be changed. Besides, preferably, steps S205-S208 are performed simultaneously (at the same timing).

As shown in FIG. 5, the first current source 20 stops based on an input control signal Sc3. That is, the sink current Isink' shown in FIG. 4 does not flow. When the sink current Isink' does not flow, the potential of the base of the first transistor 10 increases; as a result, when the voltage Vbe between the base and the emitter is below the predetermined value, the first transistor 10 is turned off. Accordingly, because the collector current of the first transistor 10 does not flow, an L level signal is output from the output circuit 100.

Here, the operation of an existing output circuit is described for comparison. As shown in FIG. 6, in time t1, the first transistor is turned on, and thus the first current source starts to apply a current of 4 [mA] for example, and sucks the base current of the first transistor. Therefore, the base current of the first transistor becomes −4 [mA]. Because the first current source applies a current of 4 [mA] until the first transistor is turned off at time t3, the base current of the first transistor maintains −4 [mA]. In addition, because the first transistor is turned off at time t3, the first current source stops and the current value becomes 0 [mA].

However, before the first transistor is actually turned off, a delay, that is, a turn-off time is generated. The PNP transistor has a property that the turn-off time depends on the base accumulated charge amount accumulated in the base during the ON state. In the example shown in FIG. 6, in time t3, the first transistor is about to be turned off, but in fact there is a delay between time t3 and time t4' at which the first transistor is actually turned off, and the time between time t3 and time t4' is a turn-off time Ttoff'.

In contrast, as shown in FIG. 7, in the output circuit 100 of the embodiment, in order to turn the first transistor 10 on at time t1, the first current source 20 starts to apply a current of 4 [mA] for example, and sucks the base current of the first transistor 10. Therefore, the base current of the first transistor becomes −4 [mA]. Then, at time t2, the first current source 20 reduces the base current to the predetermined current value of −0.8 [mA] for example. The predetermined current value is ⅕ of −4 [mA], which is the current value of the base current when the first transistor 10 is turned on. The first current source 20 applies a current of 0.8 [mA] until the first transistor 10 is turned off at time t3, and maintains the base current of the first transistor 10 at −0.8 [mA]. Then, in order to turn the first transistor 10 off at time t3, the first current source 20 stops and the current value thereof becomes 0 [mA]. In the example shown in FIG. 7, the first transistor 10 is about to be turned off at time t3, but in fact there is a delay between time t3 and time t4 at which the first transistor 10 is actually turned off, and the time between time t3 and time t4 is a turn-off time Ttoff. The turn-off time Ttoff is shorter than the turn-off time Ttoff' shown in FIG. 6 (turn-off time Ttoff<turn-off time Ttoff').

In this way, by reducing the base current to the predetermined current value after the first transistor 10 is turned on and before the first transistor 10 is turned off, the base accumulated charge amount of the first transistor 10 can be reduced compared with the case in which the base current is fixed during the ON state of the first transistor 10. Therefore, the turn-off time Ttoff of the first transistor 10 can be shortened, and a decrease in the communication speed with the external device ED can be suppressed. Besides, compared with a push-pull configuration for example, which is provided with a PNP transistor on a high side and a NPN transistor on a low side, the number of components (number of elements) can be reduced, and the output circuit 100 can be miniaturized.

The predetermined current value of the base current reduced by the first current source 20 is 1/r (r is a real number over 2) of the current value of the base current when the first transistor 10 is turned on. Accordingly, the output circuit 100 which reduces the base accumulated charge amount of the first transistor 10 can be easily realized.

Back to the description of FIG. 5, the switch 30 is turned on based on the input control signal Sc4. At this time, a discharge current Idis1 shown by a solid line arrow flows. Accordingly, due to the resistance of the first resistor 31 and the like between the base and the emitter of the first transistor 10, the base accumulated charge amount of the first transistor 10 can be discharged rapidly. Therefore, the turn-off time Ttoff of the first transistor 10 can be further shortened.

At the same time, the second current source 40 applies the constant current to the base of the first transistor 10 based on the input control signal Sc5. At this time, a reverse current Irev shown by a solid line arrow flows. Accordingly, due to the reverse current supplied to the base of the first transistor 10, the base accumulated charge amount of the first transistor 10 is discharged rapidly. Therefore, the turn-off time Ttoff of the first transistor 10 can be further shortened.

Besides, the second transistor 50 is turned on based on, for example, a control signal Sc6 input to a gate. At this time, a discharge current Idis2 shown by a solid line arrow flows. Accordingly, the inter-line parasitic capacity PC between the signal line L2 and the reference potential line L3 can be discharged. Therefore, the time required for the collector potential to reach a Low level after the first transistor 10 is turned off can be accelerated.

As shown in FIG. 7, the third current source 60 applies a constant current between the signal line L2 and the reference potential line L3 regardless of the ON state or OFF state of the first transistor 10. Accordingly, even when the second transistor 50 is turned off at time t5 for example, the constant current still flows between the signal line L2 and the reference potential line L3, and thus the inter-line parasitic capacity PC between the signal line L2 and the reference potential line L3 can be reduced. Therefore, the time required for the collector potential to reach a Low level after the first transistor 10 is turned off can be accelerated.

In the embodiment, the example is described in which the first current source 20 reduces the base current to ⅕ of the current value of the base current when the first transistor 10 is turned on, but the present disclosure is not limited thereto. For example, in a case that the output circuit 100 supplies two times of load current to the external device ED in the SIO mode, if the first current source 20 reduces the base current to 1/10 of the current value of the base current when the first transistor 10 is turned on, similar to the above-mentioned example, the base accumulated charge amount of the first transistor 10 can be reduced, and the turn-off time Ttoff of the first transistor 10 can be shortened.

As described above, in the embodiment, after the first transistor 10 is turned on and before the first transistor 10 is turned off, the base current can be reduced to the predetermined current value. Accordingly, compared with a case in which the base current is fixed during the ON state of the first transistor 10, the base accumulated charge amount of the first transistor 10 can be reduced. Therefore, the turn-off time Ttoff of the first transistor 10 can be shortened, and a decrease in the communication speed with the external device ED can be suppressed. Besides, compared with a push-pull configuration for example, which is provided with a PNP transistor on a high side and a NPN transistor on a low side, the number of components (number of elements) can be reduced, and the output circuit 100 can be miniaturized.

The embodiment described above is used to make the present disclosure easily understood, and does not interpret the present disclosure in a limitative way. The elements included in the embodiment and the arrangement, material, condition, shape and size thereof are illustrative instead of limitative, and therefore can be changed appropriately. Besides, the configurations shown in different embodiments can be partially substituted or combined with each other.

APPENDIX

1. An output circuit 100, which outputs communication signals and communicates with the external device ED, including:
a PNP first transistor 10, which is capable of outputting a collector current as the communication signal, and
a first current source 20, which is capable of changing a base current of the first transistor 10, and reduces the base current to a predetermined current value after the first transistor 10 is turned on and before the first transistor 10 is turned off.

8. An output method, which is the output method of the output circuit 100 that outputs communication signals and communicates with the external device ED, including the following step in which the first current source 20, which is capable of changing the base current of the PNP first transistor 10, reduces the base current to a predetermined current value after the first transistor 10 is turned on and before the first transistor 10 is turned off, wherein the PNP first transistor 10 is capable of outputting a collector current as a communication signal.

What is claimed is:

1. An output circuit, which outputs communication signals and communicates with an external device, comprising:
    a first transistor which is PNP type, the first transistor is capable of outputting a collector current as the communication signals; and
    a first current source, which is capable of changing a base current of the first transistor, and reduces the base current to a predetermined current value after the first transistor is turned on and before the first transistor is turned off.

2. The output circuit according to claim 1, wherein the predetermined current value is 1/r of a current value of the base current when the first transistor is turned on, wherein r is a real number over 2.

3. The output circuit according to claim 1, further comprising a switch connected between a base and an emitter of the first transistor, wherein
    the switch is turned on when the first transistor is turned off.

4. The output circuit according to claim 2, further comprising a switch connected between a base and an emitter of the first transistor, wherein
    the switch is turned on when the first transistor is turned off.

5. The output circuit according to claim 1, further comprising a second current source that supplies a constant current to a base of the first transistor when the first transistor is turned off.

6. The output circuit according to claim 2, further comprising a second current source that supplies a constant current to a base of the first transistor when the first transistor is turned off.

7. The output circuit according to claim 3, further comprising a second current source that supplies a constant current to the base of the first transistor when the first transistor is turned off.

8. The output circuit according to claim 4, further comprising a second current source that supplies a constant current to the base of the first transistor when the first transistor is turned off.

9. The output circuit according to claim 5, further comprising a second transistor that is connected to a signal line outputting the communication signals and a reference potential line, and which is turned on when the first transistor is turned off.

10. The output circuit according to claim 6, further comprising a second transistor that is connected to a signal line outputting the communication signals and a reference potential line, and which is turned on when the first transistor is turned off.

11. The output circuit according to claim 7, further comprising a second transistor that is connected to a signal line outputting the communication signals and a reference potential line, and which is turned on when the first transistor is turned off.

12. The output circuit according to claim 8, further comprising a second transistor that is connected to a signal line outputting the communication signals and a reference potential line, and which is turned on when the first transistor is turned off.

13. The output circuit according to claim 9, further comprising a third current source that applies a constant current between the signal line and the reference potential line.

14. The output circuit according to claim 10, further comprising a third current source that applies a constant current between the signal line and the reference potential line.

15. The output circuit according to claim 1, wherein the output circuit has a COM mode for communicating with the external device and a SIO mode for supplying a load current to the external device, and
    in the SIO mode, the first transistor is capable of outputting the collector current as the load current.

16. An output method, which is the output method of an output circuit that outputs communication signals and communicates with an external device, comprising a step in which
    a first current source, which is capable of changing a base current of a first transistor which is PNP type, reduces the base current to a predetermined current value after the first transistor is turned on and before the first transistor is turned off, wherein the first transistor is capable of outputting a collector current as the communication signals.

17. The output method according to claim 16, further comprising a step in which a switch connected between a base and an emitter of the first transistor is turned on when the first transistor is turned off.

18. The output method according to claim 16, further comprising a step in which a second current source supplies a constant current to the base of the first transistor when the first transistor is turned off.

19. The output method according to claim 18, further comprising a step in which a second transistor connected to a signal line outputting the communication signals and a reference potential line is turned on when the first transistor is turned off.

20. The output method according to claim 19, further comprising a step in which a third current source applies a constant current between the signal line and the reference potential line.

* * * * *